United States Patent [19]
Zhang et al.

[11] Patent Number: 5,889,792
[45] Date of Patent: Mar. 30, 1999

[54] METHOD AND APPARATUS FOR GENERATING SYNDROMES ASSOCIATED WITH A BLOCK OF DATA THAT EMPLOYS RE-ENCODING THE BLOCK OF DATA

[75] Inventors: Minda Zhang, Mesa; Gregory Bradford Tucker; Brian Roger Mears, both of Tempe, all of Ariz.

[73] Assignee: Intel Corporation, Santa Clara, Calif.

[21] Appl. No.: 722,746

[22] Filed: Oct. 1, 1996

[51] Int. Cl.$^6$ .................................................. H03M 13/00
[52] U.S. Cl. ........................................................ 371/37.11
[58] Field of Search ......................................... 371/37.11

[56] References Cited

U.S. PATENT DOCUMENTS

| | | | |
|---|---|---|---|
| 4,633,470 | 12/1986 | Welch et al. | 371/37 |
| 4,649,541 | 3/1987 | Lahmeyer | 371/37 |
| 4,782,490 | 11/1988 | Tenengolts | 371/40 |
| 4,890,287 | 12/1989 | Johnson et al. | 371/37.2 |
| 5,140,596 | 8/1992 | Weldon, Jr. | 371/39.1 |
| 5,220,568 | 6/1993 | Howe et al. | 371/37.1 |
| 5,241,546 | 8/1993 | Peterson et al. | 371/37.1 |

*Primary Examiner*—Stephen M. Baker
*Attorney, Agent, or Firm*—Blakely, Sokoloff, Taylor & Zafman LLP

[57] ABSTRACT

An improved method and apparatus for generating syndromes in a Reed-Solomon Error Correction Code decoder is disclosed. An encoder that encodes the modified code polynomial and generates a parity polynomial based on said modified code polynomial, is provided. The encoder provides the parity polynomial to a syndrome generator. The syndrome generator based on the parity polynomial generates syndromes that are provided to an error location unit and an error evaluation unit. The error location unit generates intermediate locations of corrupted symbols in a data block based on the syndromes. The error location unit determines the true location of the corrected symbols in a data block based upon the intermediate values by subtracting each intermediate location from a constant M (where M is the total number of generated parity symbols) and performing a modulo operation on the difference with $2^N$ (where N is the bit-length of the data symbol in the Galois Field). The error evaluation unit, based on the syndromes, generates error values that can be employed to correct corrupted symbols in the data block.

6 Claims, 4 Drawing Sheets

METHOD AND APPARATUS FOR GENERATING SYNDROMES ASSOCIATED WITH A BLOCK OF DATA THAT EMPLOYS RE-ENCODING THE BLOCK OF DATA

BACKGROUND OF THE INVENTION

1. Field of the Invention

This invention relates to error correction systems, and more particularly to the decoding of Reed-Solomon Error Correction Code (R-S ECC) encoded data and the generation of syndromes during the decoding.

2. Description of the Related Art

Traditional syndrome generation employs all the data and parity symbols received from a channel. Typically, syndrome generation requires M multiply operations Galois Field (GF $2^N$) (where M is the number of parity symbols for the data block, and N is the number of bits in each data symbol) to generate syndromes for the data and parity symbols received from the channel. Since a GF multiply operation is relatively complex to implement in hardware or software, an improved method and apparatus for generating syndromes that reduces the number of GF multiply operations is desired.

The prior art known to applicants does not disclose nor remotely suggest a method and apparatus for generating syndromes for a Reed-Solomon Error Correction Code (R-S ECC) decoder that employs an encoding step and performs syndrome generation on the parity symbols generated by the encoding step.

SUMMARY OF THE INVENTION

The improved method and apparatus for generating syndromes for a Reed-Solomon Error Correction Code (R-S ECC) decoder stage employs the following steps. First, a modified code polynomial is received from a channel, where the data and parity symbols represented by the code polynomial is subject to a possible source of error (e.g., noise). An encoding operation is performed on the modified code polynomial to generate a parity polynomial based on the modified code polynomial. The parity polynomial is submitted to a syndrome generator that evaluates the parity polynomial at the roots of a generating polynomial. This generating polynomial is employed to generate the parity polynomials in the initial encoding stage and is also employed to generate the parity polynomial based on the modified code polynomial received from the channel. The syndrome generator generates the syndromes based on the parity polynomial and provides the syndromes to an Error Location Unit and an Error Evaluation Unit. The Error Location Unit generates an intermediate location of the corrupted symbols in a data block based on the syndromes. To derive the true location of the corrupted symbols in a data block, each intermediate location is subtracted from a constant M, and the result is subjected to a modulo operation with $2^N$, where M is the total number of generated parity symbols, and N is the bit length of a data symbol in the Galois Field. The Error Evaluation Unit generates error values that can be employed to correct corrupted symbols in a data block based on the syndromes.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

Figure 1:
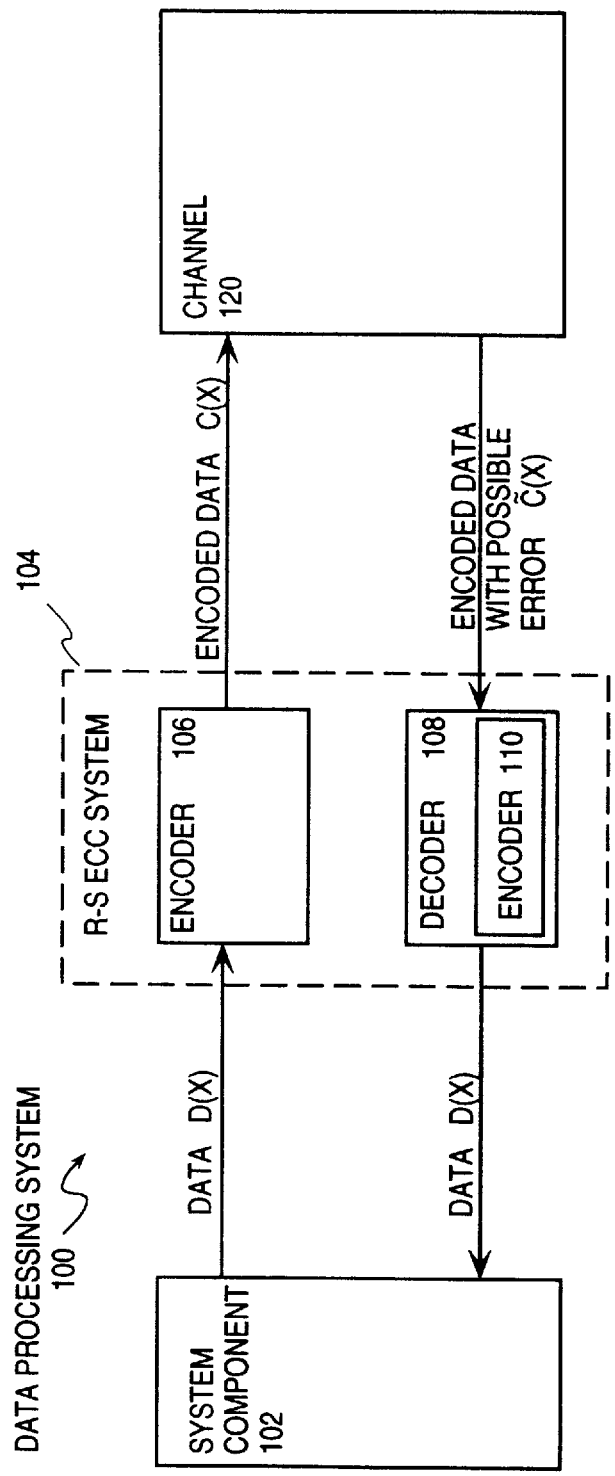
FIG. 1 illustrates a data processing system in which the present invention can be employed.

FIG. 1 illustrates a data processing system 100 in which the present invention may be implemented. The data processing system 100 includes a system component 102 that generates data D(x). The system component 102 can be any source of data (e.g., a subsystem having a processor under the direction of a program, where the processor is writing data to a storage media). The data processing system 100 also includes a Reed-Solomon Error Correction Code (R-S ECC) system 104 that is coupled to the system component 102 so as to receive the data D(x). The R-S ECC system 104 includes a encoder 106 for receiving the data D(x) and generating encoded data (represented by a code polynomial C(x)). The R-S ECC system 104 also includes decoder 108 for receiving encoded data with possible error and performing error correction to recover the data. The encoded data with possible error can be represented by a modified code polynomial ($\tilde{C}(x)$). The present invention is the improved R-S ECC decoder 108 that employs an encoder 110. The improved decoder 108 will be described in greater detail hereinafter with reference to FIGS. 2–4.

The encoder 106 provides encoded data, to a channel 120. The channel 120 provides the encoded data with possible error $\tilde{C}(x)$ to the improved decoder 108 of the present invention. The term channel is used herein to represent a source of possible error that affects the encoded data C(x), and modifies the encoded data so as to introduce possible error into the encoded data C(x).

Channel 120 can be a communication channel or a link. For example, channel 120 may be a wireless link between two base stations that are communicating with each other. In this case, the data processing system 100 can be a transceiver that is located at each of the base stations. Channel 120 can also be an input/output (I/O) subsystem that includes a storage medium, (e.g., a hard disk, floppy disk, CD ROM or other optical disks), an associated microcontroller, and associated driver software that together control the reading and writing of data to and from the storage medium. For example, channel 120 may include a hard disk controller and a hard disk unit. The hard disk controller can be implemented as a part of the motherboard, as part of a computer card or, as part of the hard disk unit.

Figure 2:
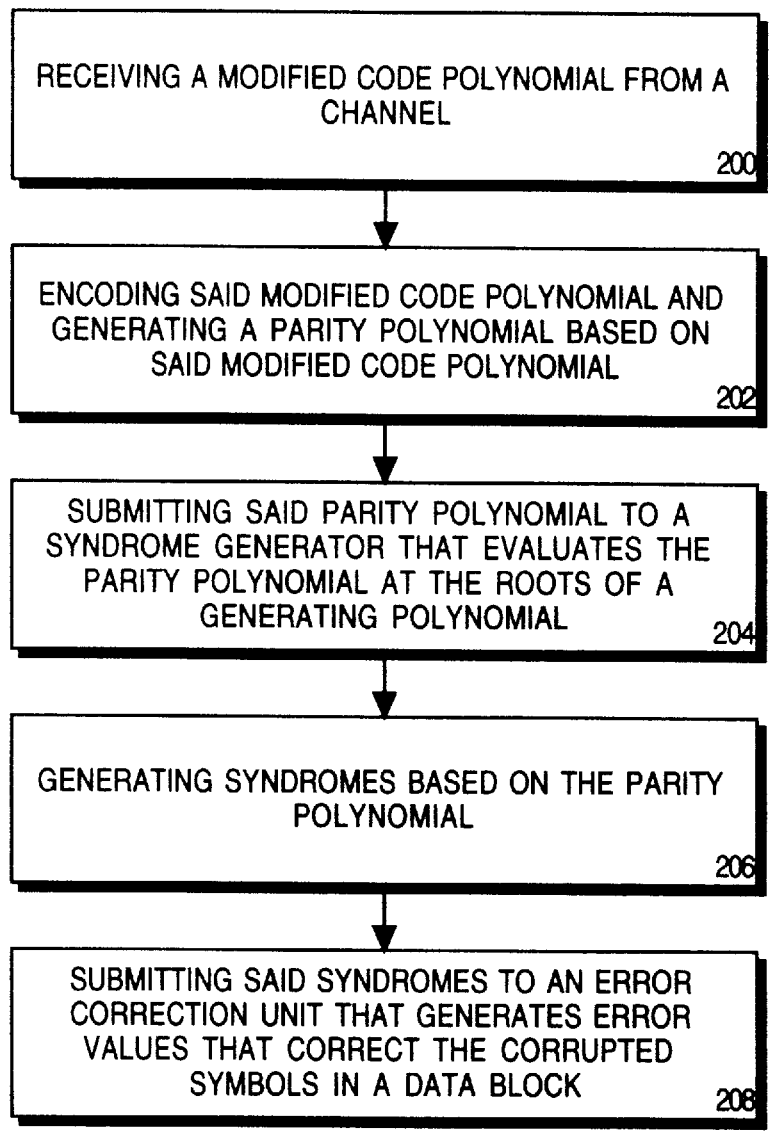
FIG. 2 is a flowchart illustrating the processing steps of the present invention, where the syndromes generated by the present invention are presented to an Error Evaluation Unit.

FIG. 2 is a flowchart illustrating the improved method of one embodiment of the present invention. In this embodiment, a modified code polynomial $\tilde{C}(x)$ that represents the data and parity symbols, are received from a channel (step 200). As discussed above, a channel is simply a source of possible error that corrupts the data and parity symbols, represented by the code polynomial. For example, a channel may be a storage media (e.g., hard disk, optical disk) or a network connection (e.g., connection with other computers, or a wireless connection such as that used in satellite communications). The term channel is used herein to represent a source of possible error (e.g., noise) that possibly corrupts the code polynomial C(x) making it into a modified code polynomial (i.e., $\tilde{C}(x)=C(x)+E(x)$).

In step 202, the present invention encodes the modified code polynomial $\tilde{C}(x)$ and generates a parity polynomial $\tilde{P}(x)$ based on the modified code polynomial $\tilde{C}(x)$. In step 204, the present invention submits the parity polynomial $\tilde{P}(x)$ to a syndrome generator that evaluates the parity polynomial $\tilde{P}(x)$ at the roots of a generating polynomial G(x). The generating polynomial G(x) is simply the polynomial used to generate the parity symbols in the original encode stage of the Reed-Solomon error correction code encoding and is also employed to generate the parity polynomial based on the modified code polynomial. It should be noted, that the syndrome generator employed in steps 204 and 206, may be any syndrome generator that is well known in the art. The functionality of one example of a prior art syndrome generator is described in a publication entitled "Practical Error Correction Design for Engineers 2nd Edition", by Neal Glover and Trent Dudley, published in 1991.

In step 206, syndromes (ss_i) are generated by the syndrome generator based on the parity polynomial $\tilde{P}(x)$. In sharp contrast to the prior art technique, prior art decoding stages of the Reed-Solomon ECC, the present invention submits only the parity polynomial $\tilde{P}(x)$ based on the modified code polynomial $\tilde{C}(x)$ to the syndrome generator instead of the entire modified code polynomial $\tilde{C}(x)$.

By employing an encoding step (step 202) and submitting the parity polynomial to the syndrome generator (step 204), the present invention effectively reduces the number of Galois Field multiply operations by approximately one-half.

In the preferred embodiment, the generating polynomial is a reversible polynomial that is adopted for Reed-Solomon error correction code implementations. Reversible polynomials are well known in the art. Reversible polynomials and their use in Reed-Solomon Encoders is described in a publication entitled "Bit-Serial Reed-Solomon Encoders", by E. R. Berlekamp, IEEE Trans. Info. Theory, Vol. IT-28, No. 6, published in 1982.

In step 208, the syndromes generated based on the parity polynomial are submitted to an Error Evaluation Unit that generates error values, which are subsequently used to correct corrupted symbols in a data block. It is important to note, that any error evaluation unit that is well known in the art, may receive the syndromes generated in step 206 and employ them for standard error correction operations without any modifications. An example of a prior art error correction unit is described in U.S. Pat. No. 5,323,402.

Figure 3:
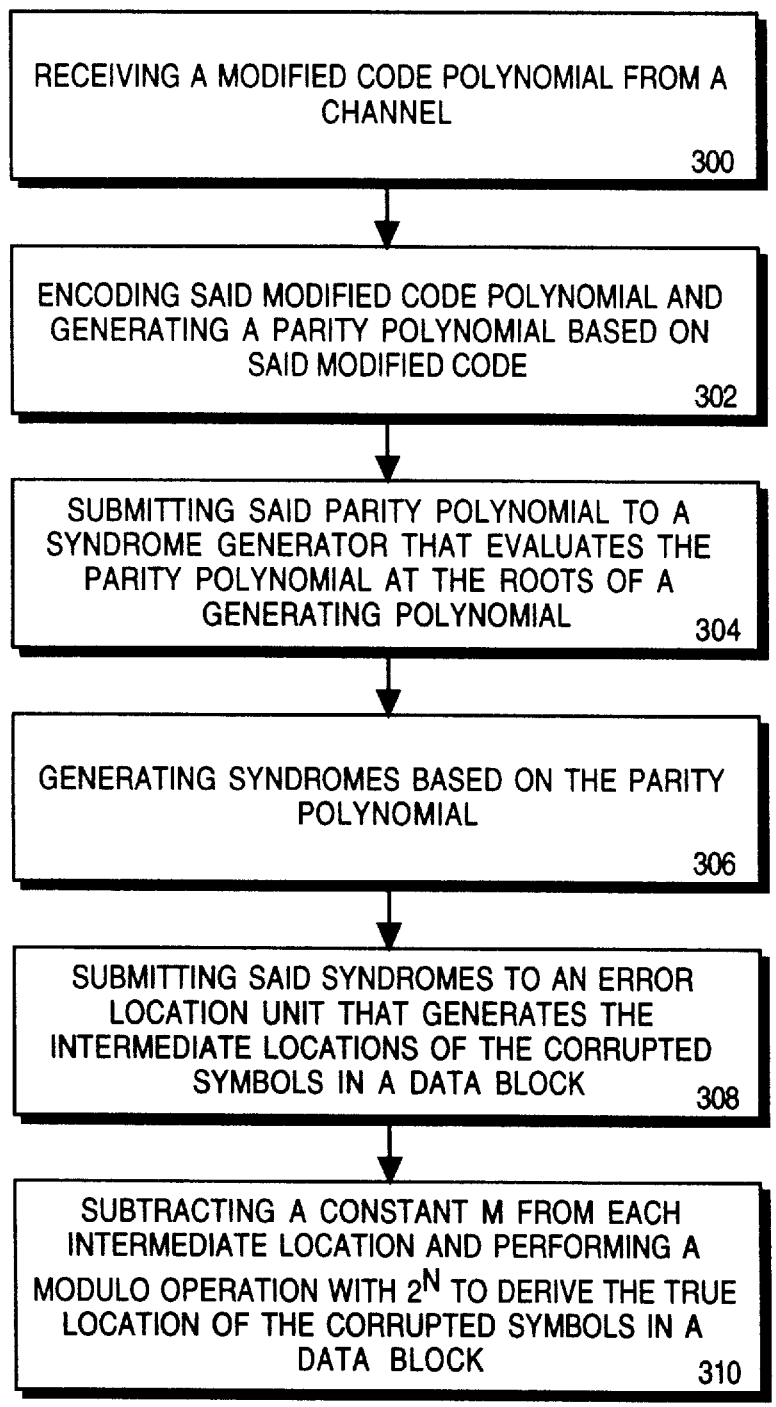
FIG. 3 is a flowchart illustrating the processing steps of the present invention in an alternative embodiment, where the syndromes generated by the present invention are presented to an Error Location Unit.

FIG. 3 is a flowchart illustrating an alternative embodiment of the present invention, where the syndromes are provided to an error location unit. In step 300, the modified code polynomial is received from a channel. In step 302, the present invention encodes the modified code polynomial and generates a parity polynomial based on the modified code polynomial. In step 304, the parity polynomial is submitted to a syndrome generator that evaluates the parity polynomial at the roots of the generating polynomial. In step 306, the present invention generates symbols based on the parity polynomial. As noted previously, in steps 304 and 306, a typical standard syndrome generator that is well known in the art may be employed.

In step 308, the syndromes are submitted to an error location unit that generates the intermediate locations of corrupted symbols in a data block. In step 310, in order to derive the true location of the corrupted symbols in a data block, the following operation is performed. First, each intermediate location is subtracted by M, where M is the number of generated parity symbols. Second, a modulo operation is performed on the difference (of M and the intermediate location) by $2^N$, where N is the bit-length of the data symbol in the Galois Field. The result of these two operations is the true locations of the corrupted symbols in the data block. An example of a prior art error location unit is the combination of the "Key Equation" block and "Chien Search" block, as described in U.S. Pat. No. 5,323,402.

Relationship Between Syndromes Generated by the Present Invention and Syndromes Generated by a Typical Syndrome Generator The traditional approach to calculate syndromes for a given code-word polynomial is to evaluate the received code-word polynomial at each root of a R-S ECC generating polynomial (e.g., $s\_i=\tilde{C}(a^i)=C(a^i)+E(a^i)$, i=120, 121, ..., 135, where a^i is a root of the generating polynomial) In this case, assume that the received code-word polynomial is a corrupted code-word polynomial (i.e., the code-word polynomial includes an error polynomial).

For example, when M is 16, N is 8, and there is 3-way interleaving for a 512 byte data block (e.g., each interleaved data block having 171 bytes), the syndrome (s_i), is generated in a traditional approach by providing all 171 bytes of data (including its 16 associated parity bytes) to a syndrome generator. Using this approach, in order to calculate a set of syndromes for one data block, it takes (171+16)*16 GF(256) multiply operations and GF(256) add operations (i.e. 3-way interleaving requires 3*(171+16)*16=8976 GF(256) multiplications and additions).

Figure 4:
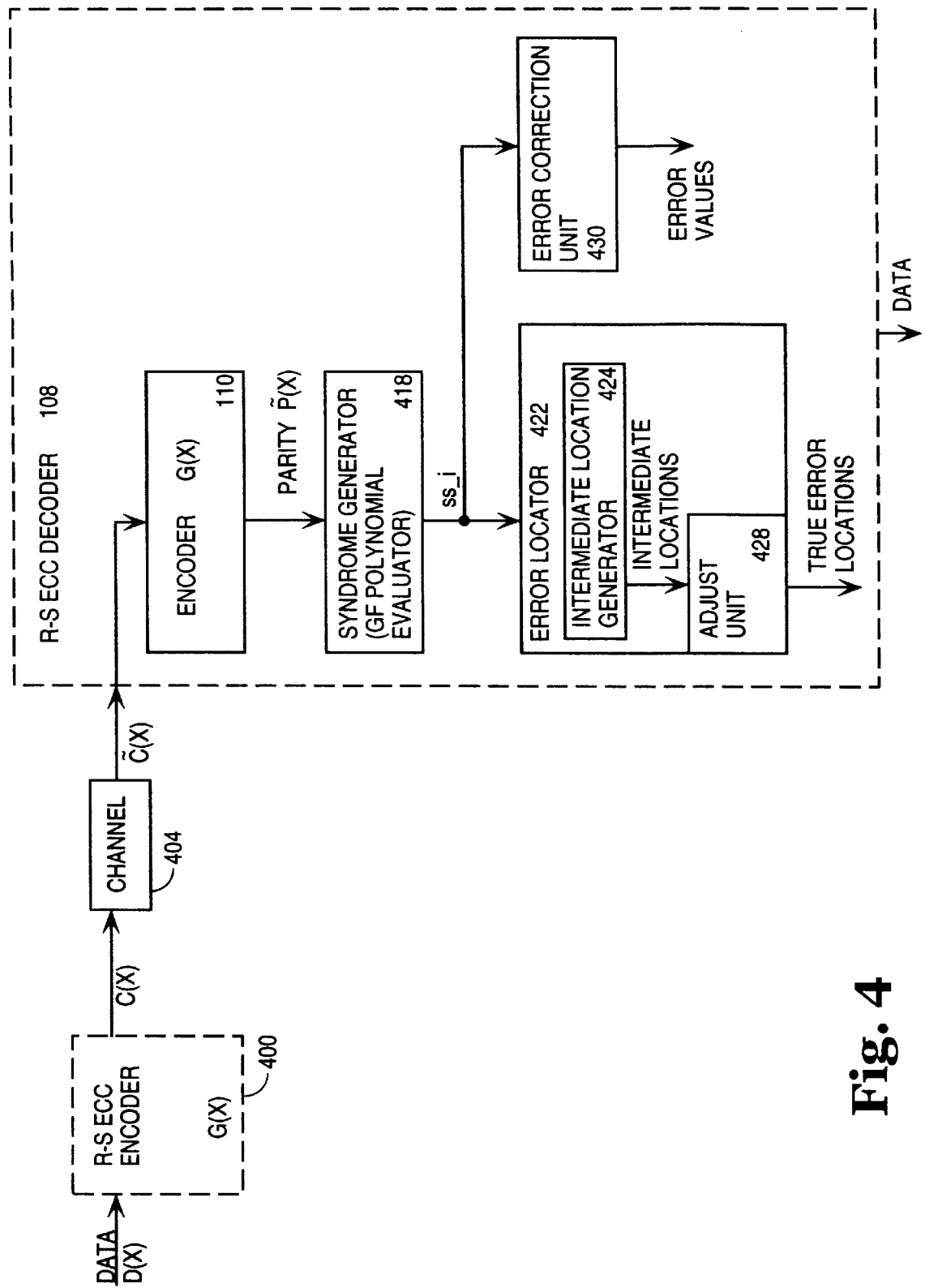
FIG. 4 is a block diagram illustrating one embodiment of the present invention.

The modified procedure of the present invention for syndrome calculation greatly reduces the overall number of GF(256) multiplications and additions. In fact, the new approach reduces the number of GF(256) multiplications and additions by approximately one-half. As shown in FIG. 4, re-encoding data with its parity symbols for an interleaved data block, generating a new set of parity symbols, and then providing this new set of parity symbols into the syndrome generator saves the number of GF operations. The present invention generates a set of modified syndromes for the whole interleaved data block.

It will be shown that the relation between syndromes (ss_i), generated by the present invention, and syndromes (s_i ), generated in a traditional way (i.e., without the invention applied) is represented by the following equation: $ss\_i=(a^{(i*M)})*s\_i$, where i=0, 1, ... M.

In fact, for each i, $ss\_i=\tilde{P}(a^i)$ and $\tilde{P}(x)=(x^M *\tilde{C}(x))$ mod (G(x)) (i.e., $ss\_i=((a^i)^M)*\tilde{C}(a^i)$. It is known that $s\_i= \tilde{C}(a^i)$ (i.e., $ss\_i=((a^i)^M)*s\_i$).

Also, it can be shown by the proposition below that the modified syndromes generated by the present invention are well suited for traditional error detection and correction schemes. For example, the syndrome generated by the present invention may be provided to an Euclidean based scheme to generate an error location polynomial. Therefore, by employing a Chien searching scheme, the roots of the error location polynomial are obtained. As noted earlier, the true location of the errors is derived by subtracting each intermediate location from a constant M and performing a modulo operation on the difference by $2^N$, where M is the number of generated parity symbols, and N is the bit-length of the data symbol in the Galois Field. For example, when M is 128 and an intermediate location is 43, the error location is derived by (128-43) mod $2^8$. Also, the syndromes generated by the present invention may be submitted and employed by a traditional error correction unit without modification as shown in FIG. 2.

Thus, using the modified procedure to calculate syndromes for one interleaving, it takes (171+16)*8+16*16 GF(256) multiply operations (i.e. 3-way interleaving syndrome generation requires 3*{(171+16)*8+16*16}=5256 GF(256) multiply operations).

Proposition

If the error polynomial $E(x) = e\_1 * x^{L\_1} + \ldots + e\_t * X^{L\_t}$, where $t = [M/2]$, and $$\begin{bmatrix} ss\_0 & ss\_1 & \ldots & ss\_(t-1) \\ ss\_1 & ss\_2 & \ldots & ss\_t \\ \cdot & \cdot & & \cdot \\ \cdot & \cdot & & \cdot \\ \cdot & \cdot & & \cdot \\ ss\_(t-1) & ss\_t & \ldots & ss\_(2t-2) \end{bmatrix} \begin{bmatrix} c\_t \\ c\_(t-1) \\ \cdot \\ \cdot \\ \cdot \\ c\_1 \end{bmatrix} = \begin{bmatrix} ss\_t \\ ss\_{13}(t+1) \\ \cdot \\ \cdot \\ \cdot \\ ss\_(2t-1) \end{bmatrix} \quad (5.1)$$

then the corresponding error location polynomial $L(x) = x^t + c\_1 * x^{(t-1)} + \ldots + c\_t$ has its roots at $a^{(M+L\_1)}, a^{(M+L\_2)}, \ldots, a^{(M+L\_t)}$.

Proof

Without losing generality, we assume that the coefficient matrix is non-singular (i.e., $c\_t, c\_(t-1), \ldots, c\_1$ has a unique solution) that satisfies, for $k=0, 1, 2, \ldots, (t-1)$ the following equations:

$$ss\_k * c\_t + ss\_(k+1) * c\_(t-1) + \ldots + ss\_(k+t-1) * c\_1 = ss\_(k+t). \quad (5.2)$$

Now, $L(x) = x^t + c\_1 * x^{(t-1)} + \ldots + c\_t$ has a unique set of roots. If we can verify that $a^{(M+L\_1)}, a^{(M+L\_2)}, \ldots a^{(M+L\_t)}$ are roots of $L(x)$, then this proof is completed.

By saying that $a^{(M+L\_i)}$ is a root of $L(x)$, it means that $$L(\hat{a}(M+L\_i)) = \sum_{l=0}^{t} c\_l * (\hat{a}(M+L\_i))^{(t-l)} = 0,$$

assuming $c\_0 = 1$.

If we can verify that $\{c\_1, c\_2 \ldots c\_t\}$ is the set of coefficients for the location polynomial $L(x)$ which has $a^{(M+L\_1)}, a^{(M+L\_2)}, \ldots a^{\hat{}(M+L\_t)}$ as its roots, and $\{c\_1, c\_2, \ldots c\_t\}$ is also the solution of above system of linear equations (5.1) (i.e., verify (5.2) for $k=0, 1, 2, \ldots (t-1)$), then this completes the proof.

Since $ss\_i = (a^{(i*M)}) * s\_i$, and $$s\_i = e(\hat{a} i) = \sum_{j=1}^{t} e\_j * [(\hat{a} i)^{\hat{}} L\_j] = \sum_{j=1}^{t} e\_j * (\hat{a}(i*L\_j)),$$

We have, for $k = 0, 1, 2, \ldots (t-1)$, $$\sum_{l=0}^{t-1} ss\_(l+k) * c\_(t-l) = \sum_{l=0}^{t-1} (\hat{a}(l+k)*M) * s\_(l+k) * c\_(t-l)$$

$$= \sum_{l=0}^{t-1} (\hat{a}(l+k)*M) \left[ \sum_{j=1}^{t} e\_j * (\hat{a}((l+k)*L\_j)) \right] * c\_(t-l)$$

$$= \sum_{j=1}^{t} e\_j \left( \sum_{l=0}^{t-1} (\hat{a}((l+k)*(M+L\_j))) * c\_(t-l) \right)$$

$$= \sum_{j=1}^{t} e\_j \left[ \sum_{l=0}^{t-1} (\hat{a}((l+k)*(M+L\_j))) * c\_(t-l) + c\_0 * \right.$$

$$\left. (\hat{a}((t+k)*(M+L\_j))) + c\_0 * (\hat{a}((t+k)*(M+L\_j))) \right]$$

$$= \sum_{j=1}^{t} e\_j \left\{ \sum_{l=0}^{t} c\_(t-l) * \hat{a}((l+k)*(M+L\_j)) \right\} +$$

$$\sum_{j=1}^{t} (\hat{a}((t+k)*(M+L\_j))) * e\_j$$

$$= \sum_{j=1}^{t} e\_j * \hat{a}\,(k*(M+L\_j)) \left\{ \sum_{l=0}^{t} c\_l * (\hat{a}\,((t-l)*(M+L\_j))) \right\} +$$

$$\left\{ \sum_{j=1}^{t} \hat{a}\,((t+k)*L\_j)*e\_j \right\} * (\hat{a}\,((t+k)*M))$$

$$= \sum_{j=1}^{t} e\_j * (\hat{a}\,(k*(M+L\_j))*L(\hat{a}\,(M+L\_j)) + (\hat{a}\,((t+k)*M))*s\_(t+k)$$

$$= (\hat{a}(t+k)*M))*s\_(t+k) = ss\_(t+k).$$

This completes the proof.

It is worth pointing out that the above proposition illustrates that (M+L__i), i=1,2, . . . ,t are the intermediate locations of the corrupted data symbols in an interleaved data block, if the syndromes ss__i are submitted to a traditional R-S ECC error location unit (e.g., U.S. Pat. No. 5,323,402). Hence, these intermediate error locations require a simple adjustment (i.e., subtracting each intermediate location from a constant M and performing a modulo operation on the difference by (2^N)).

Also, this proposition shows that error values {e__1, e__2, . . . e__t} for each corrupted data symbols in an interleaved data block will be correctly computed, if the roots γ__i=a^(M+L__i), i=1, . . . ,t , and syndromes ss__i are submitted to a traditional error evaluation unit (e.g., that described as "Recursive Extension" block in U.S. Pat. No. 5,323,402) , since, for i=0,1,2, . . . , t−1

$$\sum_{j=1}^{t} e\_j * ((\hat{a}\,(L\_j + M))\,i) = (\hat{a}\,(M*i)) \sum_{j=1}^{t} e\_j * (\hat{a}\,(L\_j*i))$$

$$= (\hat{a}\,(M*i))*s\_i = ss\_i.$$

FIG. 4 is a block diagram illustrating one embodiment of the present invention. The Reed-Solomon Error Correction Code decoder 108 of the present invention includes an encoder 110 that is coupled to a syndrome generator 418. The present invention 108 further includes an error locator 422 and an error correction unit 430, both of which are coupled to receive syndromes from the syndrome generator 418. The syndrome generator 418 is typically known as a Galois Field (GF) polynomial evaluator. The error locator 422 is typically known as a GF polynomial root-solver, and the error correction unit 430 is typically known as a GF linear system solver.

In this embodiment, intermediate location generator 424 the error locator 422 generates intermediate error locations (or offsets) that are provided to an adjust unit 428. The adjust unit 428 generates the true error locations from the offset values. The adjust unit 428 may be implemented by using a subtractor that subtract to the offsets (i.e., intermediate values) from a constant M, and a shift register that performs a modulo function between the result (i.e., difference of M and the offsets) and $2^N$ (where M is the number of generated parity symbols, and where N is the bit length of the data symbol in the Galois Field).

It should be noted that the syndromes generated from syndrome generator 418 are provided to the error correction unit 430 without any changes, and the when the error values are added to the modified code polynomial—so that the lines read "error correction unit 430 provides error values which correct for a maximum of the number of errors specified by M when the error values are added to the modified code polynomial."

FIG. 4 also illustrates a typical Reed-Solomon ECC encoder 400 that includes a first input for receiving data to be encoded (represented by D(x)) and an output for generating data having appended thereto parity symbols represented by polynomial C(x)). These parity symbols (represented by a parity polynomial P(x)) are generated by performing a modulo (or "mod") function between a predetermined generating polynomial G(x) and the data polynomial D(x). Specifically, the parity polynomial P(x) is equal to $X^M$ D(x) modulo G(x). The data and parity symbols provided to channel 404 are collectively termed a code polynomial represented by C(x) (i.e., C(x)=$X^M$ D(x)+P(x)). The output of the channel 404 (known as the modified code polynomial $\tilde{C}(x)$) includes the data symbols D(x), the parity symbols P(x), and a possible error injected by the channel represented by E(x). The modified code polynomial, represented by $\tilde{C}(x)$, is an input to the improved R-S ECC decoder 108 of the present invention.

The improved R-S ECC decoder 108 includes an encoder 110 that has an input for receiving the modified code polynomial $\tilde{C}(x)$. The encoder 110 employs the predetermined generating polynomial G(x) (noted previously in connection with the encoder 400) to generate parity symbols $\tilde{P}(x)$ based on the modified code polynomial $\tilde{C}(x)$. The R-S ECC decoder 108 also includes a syndrome generator 418 that generates syndromes based on the parity symbols $\tilde{P}(x)$ generated by the encoder 110. These syndromes (ss__i) are provided to an error locator 422 and an error correction unit 430 by the syndrome generator 418. It is important to note that unlike prior art decoders that employ a syndrome generator for generating syndromes directly from the modified code polynomial $\tilde{C}(x)$, the present invention generates syndromes based upon the parity symbols, generated by the encoder 110.

The error locator 422 includes an intermediate location generator 424 that generates intermediate error locations based upon the syndromes provided by the syndrome generator 418. An adjust unit 428 includes an input for receiving the intermediate locations from the intermediate location generator 424, and based on the intermediate error locations, generates the true error locations.

The error correction unit 430 generates error values based upon the syndromes provided by the syndrome generator 418. The true error locations and the error values are employed by a correction unit (not shown) to correct errors in the modified code polynomial. The correction unit corrects errors in the modified code polynomial by adding the error values to the coefficients, pointed to by the true error locations, of the modified code polynomial.

As noted previously, the modified code polynomial is provided to the encoder 110 that encodes the modified code polynomial $\tilde{C}(x)$ using the same generating polynomial G(x) that was employed in the R-S ECC encoder 400. A set of parity symbols, represented by parity polynomial $\tilde{P}(x)$, that corresponds to the modified code polynomial is generated by the encoder 110 and provided to syndrome generator 418.

The encoder 110 is different from the encoder 400 in that the encoder 110 does not append the parity symbols P̃(x) to the modified code polynomial, but instead provides only the parity symbols P̃(x) generated from the modified code polynomial c̃(x). As noted previously, the R-S ECC encoder 400 appends the parity symbols P̃(x) to the data symbols D(x). In all other respects, the encoder 110 has the same structure and function as the R-S ECC encoder 400.

In one embodiment, the decoder 108 is configured to accommodate GF(256) operations and a modified code polynomial having 16 check or parity symbols (i.e., N=8 and M=16).

In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

What is claimed is:

1. A method of generating syndromes for a block of data in Reed Solomon Error Correction Code decoding, the Reed Solomon Error Correction Code employing M parity symbols, with each symbol having N bits, where M and N are integers greater than or equal to one, the data represented by a modified code polynomial C̃(x), the modified code polynomial C̃(x) consisting of a data polynomial D(x), a previously generated parity polynomial P(x) and an error polynomial E(x), the error polynomial E(x) representing possible error; the method comprising the steps of:

a) receiving the modified code polynomial C̃(x), from a channel, the channel injecting the possible error represented by E(x);

b) encoding the modified code polynomial C̃(x) to generate a second parity polynomial P̃(x), the second parity polynomial P̃(x) representing a second set of parity symbols;

c) submitting the second parity polynomial P̃(x) to a syndrome generator, the syndrome generator generating symbols based on the second parity polynomial P̃(x);

d) submitting the symbols to an error location unit, the error location unit generating an intermediate location based on the syndromes, the intermediate location providing intermediate information concerning the location of the corrupted symbols in the data block;

e) subtracting each intermediate location from a constant M to generate a difference; and f) performing a modulo operation on the difference by $2^N$ to derive the true location of the error symbols in the data block.

2. The method of generating syndromes of claim 1 further comprising the step of:

submitting the symbols to an error evaluation unit, the error evaluation unit generating error values based on the symbols, the error values employed by the decoder to correct corrupted symbols in the modified code polynomial C̃(x).

3. The method of generating syndromes of claim 2 where M is equal to 16 and N equals 8.

4. The method of generating syndromes of claim 2 wherein the step of submitting the syndromes to an error location unit includes the steps of a) finding the roots of an error location polynomial L(x) by employing a Chien search; and b) performing a logarithmic operation on the roots of the error location polynomial to generate an intermediate error location.

5. A Reed-Solomon Error Correction Code decoder, the Reed Solomon Error Correction Code employing M parity symbols, with each symbol having N-bits, where M and N are integers greater than or equal to 1, the decoder comprising:

an encoder for receiving a modified code polynomial C̃(x), the modified code polynomial C̃(x) including a data polynomial D(x), a first parity polynomial P(x) and an error polynomial E(x), the encoder generating a second parity polynomial P̃(x) based on a predefined generating polynomial G(x) and the modified code polynomial;

a syndrome generator, coupled to the encoder, for receiving the second parity polynomial P̃(x) and generating syndromes based on the second parity polynomial P̃(x); and an error locator for receiving the syndromes and for generating intermediate locations of corrupted symbols in the modified code polynomial based on the syndromes, the error locator coupled to the syndrome generator and having an adjustment unit for receiving said intermediate locations and generating new locations by subtracting each said intermediate location from M and performing a modulo operation on the difference of M and the intermediate location.

6. A data processing system comprising:

(a) a system component that generates data;

(b) a Reed-Solomon Error Correction Code system, coupled to the system component for providing error correction to the data processing system, the Reed-Solomon Error Correction Code system including (i) an encoder for receiving the data and generating encoded data; and a (ii) a decoder for receiving encoded data with possible errors and generating the data, the decoder including an encoder for receiving a modified code polynomial C̃(x), the modified code polynomial C̃(x) including a data polynomial D(x), a first parity polynomial P(x) and an error polynomial E(x), the encoder generating a second parity polynomial P̃(x) based on a predefined generating polynomial G(x) and the modified code polynomial, the decoder further including a syndrome generator, coupled to the encoder, for receiving the second parity polynomial P̃(x) and generating syndromes based on the second parity polynomial P̃(x), the decoder further including an error locator, coupled to the syndrome generator, for receiving the syndromes and for generating intermediate locations of corrupted symbols in the modified code polynomial based on the syndromes, the error locator having an adjustment unit for receiving the intermediate locations and generating new locations by subtracting each the intermediate location from M and performing a modulo operation on the difference of M and the intermediate location.

* * * * *